US011962125B2

(12) United States Patent
Li et al.

(10) Patent No.: US 11,962,125 B2
(45) Date of Patent: Apr. 16, 2024

(54) WAVELENGTH CONVERSION DEVICE AND LIGHT SOURCE SYSTEM

(71) Applicant: APPOTRONICS CORPORATION LIMITED, Guangdong (CN)

(72) Inventors: Qian Li, Guangdong (CN); Yingying Liu, Guangdong (CN); Yangang Wang, Guangdong (CN); Yi Li, Guangdong (CN)

(73) Assignee: APPOTRONICS CORPORATION LIMITED, Guangdong (CN)

( * ) Notice: Subject to any disclaimer, the term of this patent is extended or adjusted under 35 U.S.C. 154(b) by 344 days.

(21) Appl. No.: 17/312,904

(22) PCT Filed: Nov. 18, 2019

(86) PCT No.: PCT/CN2019/119137
§ 371 (c)(1),
(2) Date: Jun. 10, 2021

(87) PCT Pub. No.: WO2020/119396
PCT Pub. Date: Jun. 18, 2020

(65) Prior Publication Data
US 2022/0029382 A1    Jan. 27, 2022

(30) Foreign Application Priority Data
Dec. 11, 2018 (CN) .......................... 201811511758.6

(51) Int. Cl.
*H01S 5/06* (2006.01)
*G03B 21/20* (2006.01)
*H01S 5/10* (2021.01)

(52) U.S. Cl.
CPC .......... *H01S 5/0611* (2013.01); *G03B 21/204* (2013.01); *H01S 5/101* (2013.01)

(58) Field of Classification Search
CPC . F21K 9/64; F21V 9/30; H01S 5/0611; H01S 5/101; G03B 21/204
See application file for complete search history.

(56) References Cited

U.S. PATENT DOCUMENTS 9,631,792 B2 * 4/2017 Hu ...................... G02B 19/0047
11,448,950 B2 * 9/2022 Bai ...................... G03B 21/208
(Continued)

FOREIGN PATENT DOCUMENTS

CN    103809350 A    5/2014
CN    104020633 A    9/2014
(Continued)

OTHER PUBLICATIONS

English Translation, CN 205608228, Li et al, Sep. 9, 2016 (Year: 2016).*

(Continued)

*Primary Examiner* — Peggy A Neils
(74) *Attorney, Agent, or Firm* — McCoy Russell LLP

(57) ABSTRACT

A wavelength conversion device and a light source system, including: a substrate; a first light-emitting portion disposed on the substrate, wherein the first light-emitting portion includes a first light guide area and a counterweight area provided on the same layer as the first light guide area, the first light guide area being used for guiding first light, and the counterweight area being used for making the weight distribution of the wavelength conversion device substantially uniform; and a second light-emitting portion provided on the substrate on the same side as the first light-emitting portion, the second light-emitting portion including a conversion area, and the conversion area being used to convert at least a part of excitation light into excited light for emission when the excitation light is received.

20 Claims, 6 Drawing Sheets

(56) References Cited

U.S. PATENT DOCUMENTS

| | | |
|---|---|---|
| 2008/0111974 A1 | 5/2008 | Plut |
| 2010/0171933 A1 | 7/2010 | Kim et al. |
| 2019/0146318 A1* | 5/2019 | Hsieh .................. G03B 21/204 |
| | | 362/84 |

FOREIGN PATENT DOCUMENTS

| | | |
|---|---|---|
| CN | 104566229 A | 4/2015 |
| CN | 204595412 U | 8/2015 |
| CN | 105322433 A | 2/2016 |
| CN | 205608228 U | 9/2016 |
| CN | 106483746 A | 3/2017 |
| CN | 106597787 A | 4/2017 |
| CN | 206819041 U | 12/2017 |
| CN | 207067642 U | 3/2018 |
| CN | 108535943 A | 9/2018 |
| CN | 108931879 A | 12/2018 |
| JP | 2014119492 A | 6/2014 |
| WO | 2006047446 A2 | 5/2006 |

OTHER PUBLICATIONS

ISA China National Intellectual Property Administration, International Search Report Issued in Application No. PCT/CN2019/119137, dated Feb. 10, 2020, WIPO, 6 pages.

State Intellectual Property Office of the People's Republic of China, Office Action and Search Report Issued in Application No. 201811511758.6, dated Apr. 30, 2021, 19 pages. (Submitted with Partial Translation).

* cited by examiner

WAVELENGTH CONVERSION DEVICE AND LIGHT SOURCE SYSTEM

CROSS REFERENCE TO RELATED APPLICATIONS

The present application is a U.S. National Phase of International Application No. PCT/CN2019/119137 entitled "WAVELENGTH CONVERSION DEVICE AND LIGHT SOURCE SYSTEM," and filed on Nov. 18, 2019. International Application No. PCT/CN2019/119137 claims priority to Chinese Patent Application No. 201811511758.6 filed on Dec. 11, 2018. The entire contents of each of the above-listed applications are hereby incorporated by reference for all purposes.

TECHNICAL FIELD

The present disclosure relates to the display technical field, in particular, to a wavelength conversion device and a light source system using the same.

BACKGROUND AND SUMMARY

In recent years, the laser light source are employed in more fields. The laser light source excites the fluorescent material to generate while light and has advantages, such as, high conversion efficiency, drop without efficiency, high luminance, small volume, and good controllability. The technology of remotely exciting the phosphor by blue laser light to obtain the visible light becomes a mainstream in the current laser light display market. In general, the laser fluorescent light source is designed to select different color wheels based on different types of the digital micro mirror device (DMD). 3DMD typically selects a color wheel having a single color, and the single DMD selects a color wheel having multiple different colors.

In a single DMD projection system, the blue laser light excites the segmented color wheel to generate sequential red, green, and blue light to form three primary colors. The technology of exciting phosphor by the laser light includes following disadvantages. 1: The blue laser light excites a green phosphor to generate green light, but the spectral wavelength of the green fluorescent light has a wide range, and its color is not saturated, and therefore the long-wavelength part of the light is required to be filtered out so as to improve the color coordinate, and its fluorescence utilization rate is reduced. 2: A red phosphor has attenuation performance, so finally, the light in the red wavelength band is filtered by yellow or orange phosphors, so that the obtained red light efficiency is low and the system brightness is low. In order to solve the above problems, the existing technology utilizes additional red laser light to compensate the brightness, and the red laser light acts to combine the blue laser light and the red laser light firstly, and then excite the fluorescent wheel. This solution has the disadvantages in that after the red laser light irradiates the phosphors, there is a certain loss in this process and the efficiency is reduced greatly. As the requirements of the display technology industry are getting higher, when combining the laser light and the fluorescent light, it becomes the trend of development of the industry to reduce loss of laser light and fluorescent light and increase utilization efficiency thereof.

An aspect of the present disclosure provides a wavelength conversion device. The wavelength conversion device includes a substrate, a first light-emitting portion provided on the substrate, and a second light-emitting portion provided on a same side of the substrate as the first light-emitting portion. The first light-emitting portion includes a first light guiding region and a counterweight region arranged on a same layer as the first light guiding region, the first light guiding region is configured to guide first light, and the counterweight region is configured to balance weight distribution of the wavelength conversion device into substantially uniform distribution. The second light-emitting portion includes a conversion region configured to convert at least a part of excitation light into excited light when the conversion region receives the excitation light, and configured to emit the excited light.

Another aspect of the present disclosure provides a light source system. The light source system includes the above wavelength conversion device, an excitation light source configured to emit the excitation light to the second light-emitting portion, and a first light source configured to emit the first light to the first light guiding region. At least a part of the excited light is converted into excitation light by the conversion region and then emitted therefrom.

In the wavelength conversion device provided by the present disclosure, the first light is incident to the first light-emitting portion and is guided by the first light guiding region of the first light-emitting portion. The excitation light is incident to the second light-emitting portion and is partially converted into the excited light, and the excited light is emitted. The excited light is combined with unconverted excitation light and reflected first light, and the combined light is emitted as light of the light source. The first light and the excitation light are incident to different regions of the wavelength conversion device, thereby avoiding that the first light is incident to the second light-emitting portion. When the first light is incident to the second light-emitting portion, the light energy may be lost. Therefore, the wavelength conversion device in the embodiments effectively reduces the loss of light energy of the first light, increases the efficiencies of the excitation light and the first light, and increases the brightness and saturation of the light of the light source.

In addition, the counterweight region is provided so that the cost of the wavelength conversion device is controllable while the weight distribution of the wavelength conversion device is uniform, which maintains the equilibrium of the wavelength conversion device and improves the stability of the wavelength conversion device when the wavelength conversion device rotates.

REFERENCE SIGNS DESCRIPTION OF MAIN COMPONENTS

The following specific embodiments will further illustrate the present disclosure with reference to the above drawings.

| | |
|---|---|
| Wavelength conversion device | 100 |
| Substrate | 110 |
| Groove | 111 |
| First light-emitting portion | 120 |
| First light guiding region | 121 |
| Counterweight region | 122 |
| Second light guiding region | 123 |
| Second light-emitting portion | 130 |
| Conversion region | 131 |
| First conversion unit | 1311 |
| Second conversion unit | 1312 |
| Third conversion unit | 1313 |
| First reflective region | 132 |
| Base material | a |
| Diffuse reflection layer | b |
| Luminescent layer | c |
| Heat dissipation sheet | 140 |
| Driver | 150 |
| Light source system | 200 |
| Excitation light source | 210 |
| First light source | 220 |
| First light guiding structure | 230 |
| Second light guiding structure | 240 |
| Second light source | 250 |

DETAILED DESCRIPTION

In a wavelength conversion device, excitation light is projected to a conversion region of a second light-emitting portion so as to be converted into excited light that is emitted, first color compensation light for compensation is not projected to the conversion region and is projected to the first light guiding region and then is directly reflected by the first light guiding region. After that, the reflected first color compensation light is combined with the excited light, which improves the utilization efficiency.

First Embodiment

Figure 1:
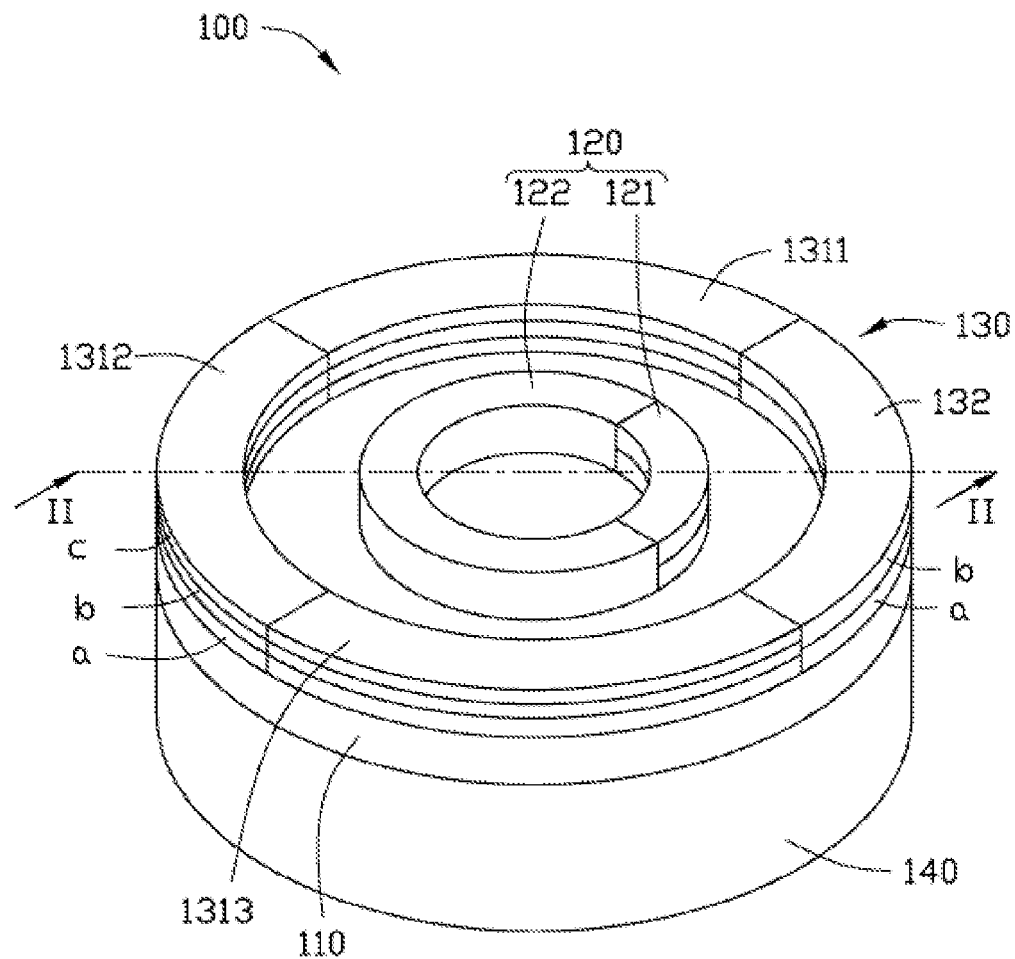
FIG. 1 is a schematic perspective view showing a structure of a wavelength conversion device according to a first embodiment of the present disclosure.

Referring to FIG. 1, FIG. 1 shows a wavelength conversion device 100 according to this embodiment, and the wavelength conversion device 100 in the present embodiment is a color wheel. The wavelength conversion device 100 is rotatable around a central axis of the color wheel during the operating process. In other embodiments, the wavelength conversion device 100 may be other structures, such as a fixed fluorescent sheet or an oscillating wavelength conversion structure, and the structure of the wavelength conversion device 100 is not limited thereto.

Figure 2:
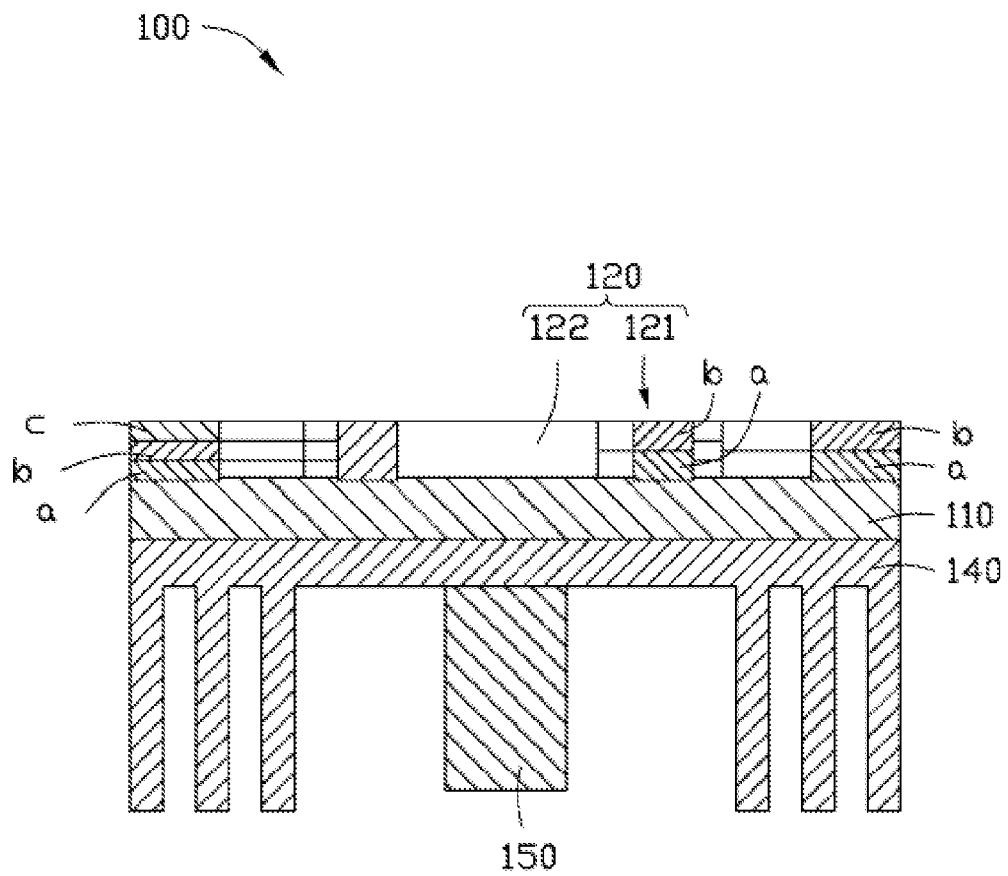
FIG. 2 is a schematic sectional view of the wavelength conversion device along II-II as indicated in FIG. 1.

Referring to FIG. 1 and FIG. 2 simultaneously, the wavelength conversion device 100 in the present embodiment includes a substrate 110, and a first light-emitting portion 120 and a second light-emitting portion 130 that are disposed on a same side of the substrate 110. Each of the first light-emitting portion 120 and the second light-emitting portion 130 is in a shape of a circular ring, and the second light-emitting portion 130 surrounds the first light-emitting portion 120. In the some embodiment, the first light-emitting portion 120 and the second light-emitting portion 130 are separated from each other, and when first light is incident to the first light-emitting portion 120, the first light is far away from the second light-emitting portion 130, which prevents the first light from being mistakenly incident to the second light-emitting portion 130. In other embodiments, the first light-emitting portion 120 and the second light-emitting portion 130 may be connected to each other, which can reduce the area covering the substrate 110 and thus reduce the size of the substrate 110. That is, the cost of the wavelength conversion device 100 is reduced. In the present embodiment, substrate 110 may have a shape of an entire disk. The first light-emitting portion 120 and the second light-emitting portion 130 both have a shape of a circular ring such that the substrate 110 also has a shape of a circular ring in other embodiments, in order to only utilize essential material.

Specifically, the substrate 110 is configured to carry the first light-emitting portion 120 and the second light-emitting portion 130. The substrate 110 may be an aluminium oxide substrate, a sapphire substrate, an aluminium nitride substrate, a silicon nitride substrate, a silicon carbide substrate, a boron nitride substrate, a beryllium oxide substrate, or the like, which are ceramic plates having a compact structure and without a porous structure. These materials have a thermal conductivity greater than or equal to 80 W/mK and a melting point substantially greater than or equal to 2000° C. Thus, these materials can withstand relatively high temperatures while achieving heat conduction. In embodiments where there is no high thermal conductivity requirement to the ceramic plate, the ceramic plate may be made of other types of ceramic plates. In some embodiments, the substrate 110 is an aluminium nitride substrate and has a thickness of 0.7 mm.

In some embodiments, the first light-emitting portion 120 includes a first light guiding region 121 and a counterweight region 122, the first light guiding region 121 is configured to guide the first light, and the counterweight region 122 is configured to balance the weight distribution of the wavelength conversion device 100 into substantially uniform distribution. In the present embodiment, the first light guiding region 121 is configured to reflect the first light. In other embodiment, the first light guiding region 121 is configured to transmit the first light.

The first light guiding region 121 has a double-layer structure, and includes a base material a and a diffuse reflection layer b that are sequentially stacked, the base material a is disposed on the substrate 110, and the diffuse reflection layer b is disposed on a side of the base material a facing away from the substrate 110. The base material a is made of a similar material to the substrate 110, which will not be repeated herein. The diffuse reflection layer b includes white scattering particles that are configured to reflect the first light. The white scattering particles are commonly salts powder or oxide powder, such as, ultra-white monomer powder particles having a particle size ranging from 20 nm to 5 μm, such as aluminium oxide, titanium oxide, aluminium nitride, magnesium oxide, boron nitride, zinc oxide, zirconium oxide, barium sulfate, or a mixture of at least two power particles of these powder particles. These white scattering materials substantially do not absorb light and have stable properties, and thus will not be oxidized or decomposed. In some embodiments, the ultra-white monomer powder particles include aluminium oxide powder particles and titanium oxide powder particles and have a particle size ranging from 0.02 μm to 1 μm.

The counterweight region 122 has a structure of a single layer and is made of cheap material as counterweight, which can ensure the cost of the wavelength conversion device 100 be controllable while balancing the weight distribution of the wavelength conversion device 100 into substantially uniform distribution, thereby maintaining the equilibrium of the wavelength conversion device 100 and improving stability of the wavelength conversion device 100 during the rotation.

Figure 3:
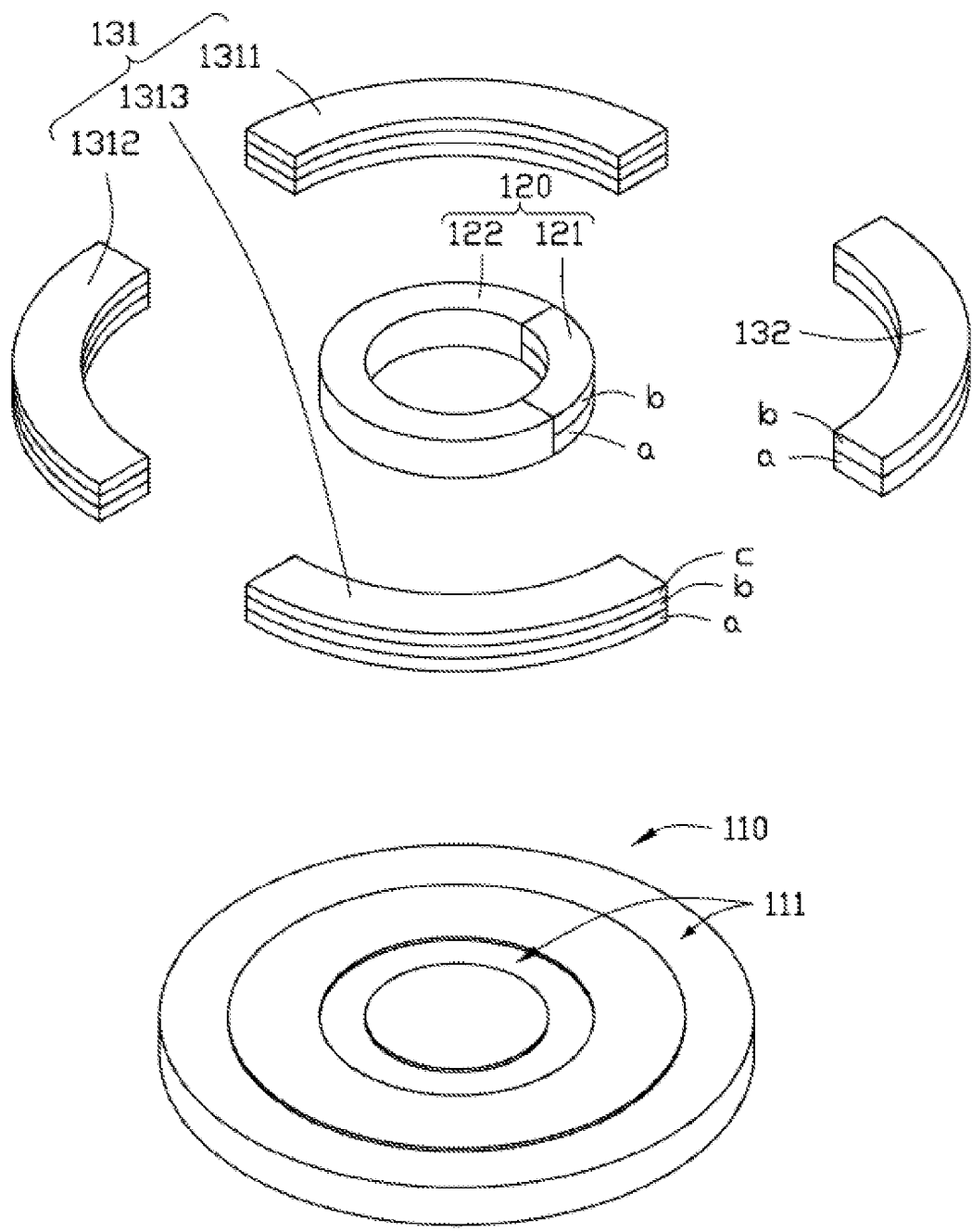
FIG. 3 is an exploded view showing the structure of the wavelength conversion device in FIG. 1.

Referring to FIG. 1 to FIG. 3, the second light-emitting portion 130 includes a conversion region 131 and a first reflective region 132, the conversion region 131 is configured to convert at least a part of excitation light into excited light when the conversion region receives the excitation light and configured to emit the excited light, and the first reflective region 132 is configured to reflect the excitation light. Each of the conversion region 131 and the first reflective region 132 has a shape of sector ring, and the conversion region 131 and the first reflective region 132 are connected end to end to form the second light-emitting portion 130. The second light-emitting portion 130 has a shape of circular ring.

The conversion region 131 includes a first conversion unit 1311, a second conversion unit 1312, and a third conversion unit 1313 that are spliced. The first conversion unit 1311 is configured to convert at least a part of the excitation light into first-color excited light and emit the first-color excited light. The second conversion unit 1312 is configured to convert at least a part of the excitation light into second-color excited light and emit the second-color excited light. The third conversion unit 1313 is configured to convert at least a part of the excitation light into third-color excited light and emit the third-color excited light.

Each of the first conversion unit 1311, the second conversion unit 1312, and the third conversion unit 1313 has a triple-layer structure. Each of the first conversion unit 1311, the second conversion unit 1312, and the third conversion unit 1313 includes a base material a, a diffuse reflection layer b, and a luminescent layer c that are sequentially stacked. The base material a is provided on the substrate 110, the diffuse reflection layer b is provided on a side of the base material a facing away from the substrate 110, and the luminescent layer c is provided on a side of the diffuse reflection layer b facing away from the substrate 110. In the present embodiment, the base material a is made of the same material as the substrate 110, which will not be repeated herein.

The diffuse reflection layer b includes white scattering particles that are configured to reflect incident excitation light. The white scattering particles are generally salts powder or oxide powder, for example, ultra-white monomer powder having a particle size ranging from 20 nm to 50 μm, such as aluminium oxide, titanium oxide, aluminium nitride, magnesium oxide, boron nitride, zinc oxide, zirconium oxide, barium sulfate, or a mixture of at least two of these powder particles. These white scattering materials substantially do not absorb light and have stable properties, and thus will not be oxidized or decomposed. In some embodiments, the ultra-white monomer powder particles are aluminium oxide scattering particles and titanium oxide scattering particles and have a particle size ranging from 0.02 μm to 1 μm.

In the present embodiment, the diffuse reflection layers b of the first conversion unit 1311, the second conversion unit 1312, and the third conversion unit 1313 include different components, and are mainly different in the types and numbers of the diffuse reflection particles of the diffuse reflection layers b. Specifically, the diffuse reflection particles of the second conversion unit 1312 mainly include $TiO_2$ particles and also include other diffuse reflection particles as auxiliary components, so that the reflectivity of red light is relatively high. It should be understood that, in other embodiments, the diffuse reflection layers b of the first conversion unit 1311, the second conversion unit 1312, and the third conversion unit 1313 may also be formed by diffuse reflection particles of the same type and have the same number of diffuse reflection particles.

The luminescent layer c is filled with a phosphor, and the phosphor is configured to absorb the excitation light and is exited to generate light having a wavelength different from that of the excitation light. For example, a YAG phosphor may absorb blue light, ultraviolet light and on the like to generate yellow exited light; a LuAG phosphor may generate green exited light; and a red phosphor is configured to absorb the excitation light to generate red exited light. The phosphor may be other phosphor that can generate exited light of other colors.

In the present embodiment, the excitation light is blue laser light, the first-color exited light is yellow fluorescent light, the second-color exited light is red fluorescent light, and the third-color exited light is green fluorescent light. That is, the first conversion unit 1311 is configured to convert a part of the blue laser light into the yellow fluorescent light, the second conversion unit 1312 is configured to convert a part of the blue laser light into the red fluorescent light, and the third conversion unit 1313 is configured to convert a part of the blue laser light into the green fluorescent light.

The luminescent layers c of the first conversion unit 1311, the second conversion unit 1312, and the third conversion unit 1313 are different in the type of the phosphor. Specifically, the phosphor of the luminescent layer c of the first conversion unit 1311 is made of yellow YAG phosphor, and a part of the blue laser light is converted into yellow fluorescent light (i.e., the first-color exited light) when receiving the blue laser light. The phosphor of the luminescent layer c of the second conversion unit 1312 may be yellow YAG phosphor of the same type as that of the first conversion unit 1311, and a filter is subsequently provided to filter the red fluorescent light. The yellow phosphor having a longer wavelength may be used to obtain more red color, or the red phosphor may be used, and the specific selection is related to properties, such as, the power, heat generation amount, and heat property. When receiving the blue laser light (i.e., the excitation light), a part of the blue laser light is converted into red fluorescent light (i.e., the second-color exited light). The phosphor of the luminescent layer c of the third conversion unit 1313 is green phosphor, and a part of the blue laser light is converted into green fluorescent light (i.e., the third-color exited light) when receiving the blue laser light.

The first reflective region 132 has a double-layer structure, and includes a base material a and a diffuse reflection layer b, the base material a is disposed on the substrate 110, and the diffuse reflection layer b is provided on a side of the base material a facing away from the substrate 110. The diffuse reflection layer b of the first reflective region 132 may have the same structure and made of the same material as the diffuse reflection layers b of the first conversion unit 1311, the second conversion unit 1312, and the third conversion unit 1313, or may have a different structure and made of a different material from the diffuse reflection layers b of the first conversion unit 1311, the second conversion unit 1312, and the third conversion unit 1313, and the details are referred to the above description.

In some embodiments, the first conversion unit 1311, the second conversion unit 1312, the third conversion unit 1313, the first light guiding region 121, and the first reflective region 132 have the same thickness in an emitting direction of the excited light, each of the first conversion unit 1311, the second conversion unit 1312, and the third conversion unit 1313 has a triple-layer structure, and each of the first light guiding region 121 and the first reflective region 132 has a double-layer structure. In this way, the thickness requirement is satisfied by increasing a thickness of at least one of the base material a or the diffuse reflection layer b of the first light guiding region 121 and the first reflective region 132.

Further, the base materials a of the first conversion unit 1311, the second conversion unit 1312, the third conversion unit 1313, the first light guiding region 121, and the first reflective region 132 may be of the same material, or any two thereof are of the same material, or may be different from each other, which may be selected in accordance with actual requirements. In an embodiment, the material of the base material a matches heat dissipation properties, optical properties, thermal expansion coefficient and the like of the structure (including the diffuse reflection layer b and the luminescent layer c) provided on the base material a. For example, the second conversion unit 1312 is configured to convert a part of the blue laser light into red fluorescent light so that the second conversion unit 1312 has a significant heat effect. In this way, a material having a high thermal conductivity coefficient, such as, aluminium nitride, is the best choice for the base material a of the second conversion unit 1312. The first conversion unit 1311 is configured to convert a part of the blue laser light into yellow fluorescent light and the third conversion unit 1313 is configured to convert a part of the blue laser light into green fluorescent light, and thus the first conversion unit 1311 and the third conversion unit 1313 are slightly affected by the heat effect. In this way, materials having a low heat conductivity, such as sapphire or other type of material, may be selected to form the base material a based on cost and process. The base material a may be made of metal, and matches the diffuse reflection layer b and the luminescent layer c that are made of silica gel materials. Several base materials may be a ceramics/monocrystal base material, and the remaining base materials may select a metal base material.

Referring to FIG. 2, in the present embodiment, the wavelength conversion device 100 further includes heat dissipation sheets 140 and a driver 150. The heat dissipation sheets 140 are provided on a side of the substrate 110 facing away from the first light-emitting portion 120. In the present embodiment, the wavelength conversion device 100 includes a plurality of heat dissipation sheets 140 that is configured to dissipate heat generated by the wavelength conversion device 100 during the operating process thereof, which is beneficial to its normal operating. The driver 150 in the present embodiment is a motor, and the motor is provided on a side of each of the heat dissipation sheets 140 facing away from the substrate 110 and is configured to drive the wavelength conversion device 100 to rotate.

Referring to FIG. 3, a method for manufacturing or assembling the wavelength conversion device 100 is described below. The substrate 110 is provided with a ring-shaped groove 111. Since the first light-emitting portion 120 and the second light-emitting portion 130 that have a shape of circular ring are disposed on the substrate 110, in the present embodiment, the substrate 110 is provided with two grooves 111 that are used to fix the first light-emitting portion 120 and the second light-emitting portion 130, respectively. The specific fixing way includes: injecting a heat-conducting adhesive glue into the grooves 111 on the surface of the substrate 110; sequentially splicing and adhering the first conversion unit 1311, the second conversion unit 1312, the third conversion unit 1313, the first light guiding region 121, the first reflective region 132, and the counterweight region 122 in an arbitrary order; and after finishing the splicing, performing pre-curing at 50° C. and curing at 150° C. The sizes of the grooves 111 match respective color wheel modules and the first light-emitting portion 120, which facilities the positioning of the first conversion unit 1311, the second conversion unit 1312, the third conversion unit 1313, the first light guiding region 121, the first reflective region 132, and the counterweight region 122 when assembling them, and also can prevent the adhesive glue from flowing in all directions during the heating process.

The first conversion unit 1311, the second conversion unit 1312, and the third conversion unit 1313 are formed in similar method, and the following will take the formation of the first conversion unit 1311 as an example. The aluminium oxide and the titanium oxide are uniformly mixed with glass powder and organic carrier in a certain proportion. The mixture is coated on the base material a for exmple, aluminium nitride) in a screen printing manner or a stencil printing manner and is pre-dried at an 50° C.-30° C. in an oven, to obtain a green body of the diffuse reflective layer b. Samples including the aluminium oxide base material a and the green body of the diffuse reflective layer b are placed in a muffle furnace to sinter at 500° C.-1200° C. to obtain the first conversion unit 1311. The diffuse reflective layer b has a thickness ranging from 30 µm to 200 µm. In some embodiments, the diffuse reflective layer b has a thickness ranging from 50 µm to 90 µm. The luminescent layer c has a thickness ranging from 100 µm to 250 µm. In some embodiments, the luminescent layer c has a thickness ranging from 130 µm to 180 µm.

In the present embodiment, a position of a laser light source (not shown in figures) emitting the excitation light is fixed. When the wavelength conversion device 100 is in an operating state, the wavelength conversion device 100 rotates around its central axis in a constant velocity. The excitation light is incident to the first conversion unit 1311, the second conversion unit 1312, the third conversion unit 1313, and the first reflective region 132 of the wavelength conversion device 100 in a time-division manner. When the excitation light is incident to the first conversion unit 1311, the first conversion unit 1311 convers a part of the blue laser light into yellow fluorescent light and emits the yellow fluorescent light and an unconverted part of the blue laser light. Similarly, when the excitation light is incident to the second conversion unit 1312, the second conversion unit 1312 convers a part of the blue laser light into red fluorescent light and emits the red fluorescent light and an unconverted part of the blue laser light. When the excitation light is incident to the third conversion unit 1313, the third conversion unit 1313 convers a part of the blue laser light into green fluorescent light and emits the green fluorescent light and an unconverted part of the blue laser light. When the excitation light is incident to the first reflective region 132, the first reflective region 132 reflects the excitation light.

When the excitation light is incident to the second conversion unit 1312, a first light source (not shown in figures) that is configured to emit the first light is turned on simultaneously, and the position of the first light source is also fixed. In the present embodiment, the first light emitted by the first light source is red laser light. When the excitation light is incident to the second conversion unit 1312, the second conversion unit 1312 convers a part of the blue laser light into the red fluorescent light and emits the red fluorescent light and an unconverted part of the blue laser light. When the red laser light is incident to the first light guiding region 121 of the first light-emitting portion 120, the first light guiding region 121 reflects the red laser light. In this way, the red fluorescent light and the unconverted part of the blue laser light that are emitted from the second conversion unit 1312 during the same period as the red laser light, and the red laser light are combined and then emitted.

In the present embodiment, a degree of central angle of the first light guiding region 121 reflecting the red laser light is the same as that of the second conversion unit 1312 emitting the red fluorescent light, an axis of symmetry of the first light guiding region 121 and an axis of symmetry of the second conversion unit 1312 are located on the same straight line, and the counterweight region 122 is closer to the second conversion unit than the first light guiding region 121. The first light guiding region 121 and the second conversion unit 1312 are arranged based on the above position relationship, which makes the red fluorescent light and the red laser light have the same optical path when they are emitted, thereby facilitating the focusing of the red fluorescent light and the red laser light after being combined.

In the wavelength conversion device 100 according to the present disclosure, the first light is incident to the first light-emitting portion 120 and is reflected by the first light guiding region 121 of the first light-emitting portion 120. The excitation light is incident to the second light-emitting portion 130 and is partially converted into the excited light, and the excited light is emitted. The excited light is combined with unconverted excitation light and the reflected first light, and the combined light is used as light of the light source and emitted. The first light serves as light emitted by a compensation light source of the light path system, which increases the brightness, the saturation and other property of the light emitted by the light source. It should be ensured that the first light is utilized to a greater extend. In the present embodiment, the first light and the excitation light are incident to different regions of the wavelength conversion device 100, thereby avoiding that the first light is incident to the second light-emitting portion 130. When the first light is incident to the second light-emitting portion 130, the light energy may be lost. Therefore, the wavelength conversion device in the embodiments effectively reduces the loss of light energy of the first light, increases the efficiencies of the excitation light and the first light, and increases the brightness and saturation of the light emitted by the light source.

In addition, the counterweight region 122 is provided such that the cost of the wavelength conversion device 100 is controllable while the weight distribution of the wavelength conversion device 100 is uniform. Accordingly, the equilibrium of the wavelength conversion device 100 is maintained, and the stability of the wavelength conversion device 100 is thus improved during the rotation.

In another aspect, the wavelength conversion device 100 of the present disclosure are manufactured by splicing and assembling individual modules, i.e., the first light guiding region 121, the counterweight region 122, the first conversion unit 1311, the second conversion unit 1312, the third conversion unit 1313, and the first reflective region 132, onto the substrate 110, so that the manufacturing process is simple and has a high yield. Further, the base materials a, the diffuse reflection layers b, and the luminescent layers c of the first light guiding region 121, the first conversion unit 1311, the second conversion unit 1312, the third conversion unit 1313, and the first reflective region 132 can select different materials in accordance with actual requirements, which can obtain more optimized property (for example, heat conduction property) and improve user experience.

Second Embodiment

Figure 4:
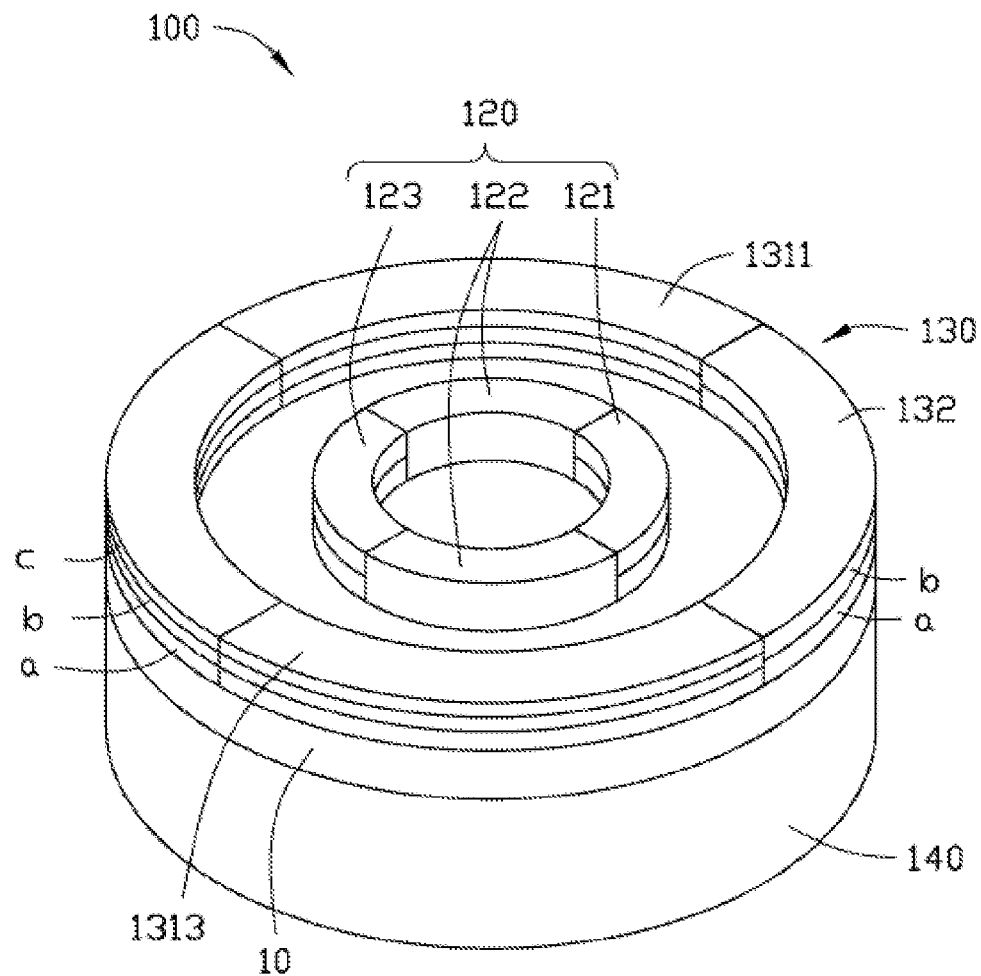
FIG. 4 is a schematic perspective view showing a structure of a wavelength conversion device according to a second embodiment of the present disclosure.

As shown in FIG. 4, the present embodiment provides a wavelength conversion device 100, which is different from the first embodiment in that the first light-emitting portion 120 not only includes the first light guiding region 121 and the counterweight region 122, but also includes a second light guiding region 123 that is configured to guide second light. The second light guiding region 123 has a shape of sector, and the first light guiding region 121, the counterweight region 122, and the second light guiding region 123 are spliced end to end to form a circular ring. In the present embodiment, the second light guiding region 123 is configured to reflect the second light. In another embodiment, the second light guiding region 123 may be configured to transmit the second light.

The following only describes the differences from the first embodiment in detail.

In the present embodiment, color of the third-color excited light emitted from the third conversion unit 1313 is the same as that of the second light. A degree of central angle of the second light guiding region 123 is the same as that of the third conversion unit 1313, and an axis of symmetry of the second light guiding region 123 and an axis of symmetry of the third conversion unit 1313 are located on the same straight line. The first light guiding region 121 is closer to the third conversion unit 1313 than the first reflective region 132.

When the excitation light is incident to the second conversion unit 1312, the first light source (not shown in figures) configured to emit the first light is turned on simultaneously, and the position of the first light source is fixed. In the present embodiment, the first light emitted by the first light source is red laser light. When the excitation light is incident to the second conversion unit 1312, the second conversion unit 1312 convers a part of the blue laser light into red fluorescent light and emits the red fluorescent light and an unconverted part of the blue laser light. When the red laser light is incident to the first light guiding region 121 of the first light-emitting portion 120, the first light guiding region 121 reflects the red laser light. In this way, the red fluorescent light and the unconverted part of the blue laser light that are emitted from the second light-emitting portion 130 at the same period as the red laser light, and the red laser light are combined and then emitted.

When the excitation light is incident to the third conversion unit 1313, the second light source (not shown in figures) configured to emit the second light is turned on simultaneously, and the position of the second light source is fixed. In the present embodiment, the second light emitted by the second light source is green laser light. When the excitation light is incident to the third conversion unit 1313, the third conversion unit 1313 convers a part of the blue laser light into green fluorescent light and emits the green fluorescent light and an unconverted part of the blue laser light. When the green laser light is incident to the second light guiding region 123 of the first light-emitting portion 120, the second light guiding region 123 reflects the green laser light. In this way, the green fluorescent light and the unconverted part of the blue laser light that are emitted by the second light-emitting portion 130 at the same period as the green laser light, and the green laser light are combined and then emitted.

It should be understood that the wavelength conversion device 100 is provided with the green laser light, which further improves the brightness and saturation of the light emitted by the light source.

Third Embodiment

Figure 5:
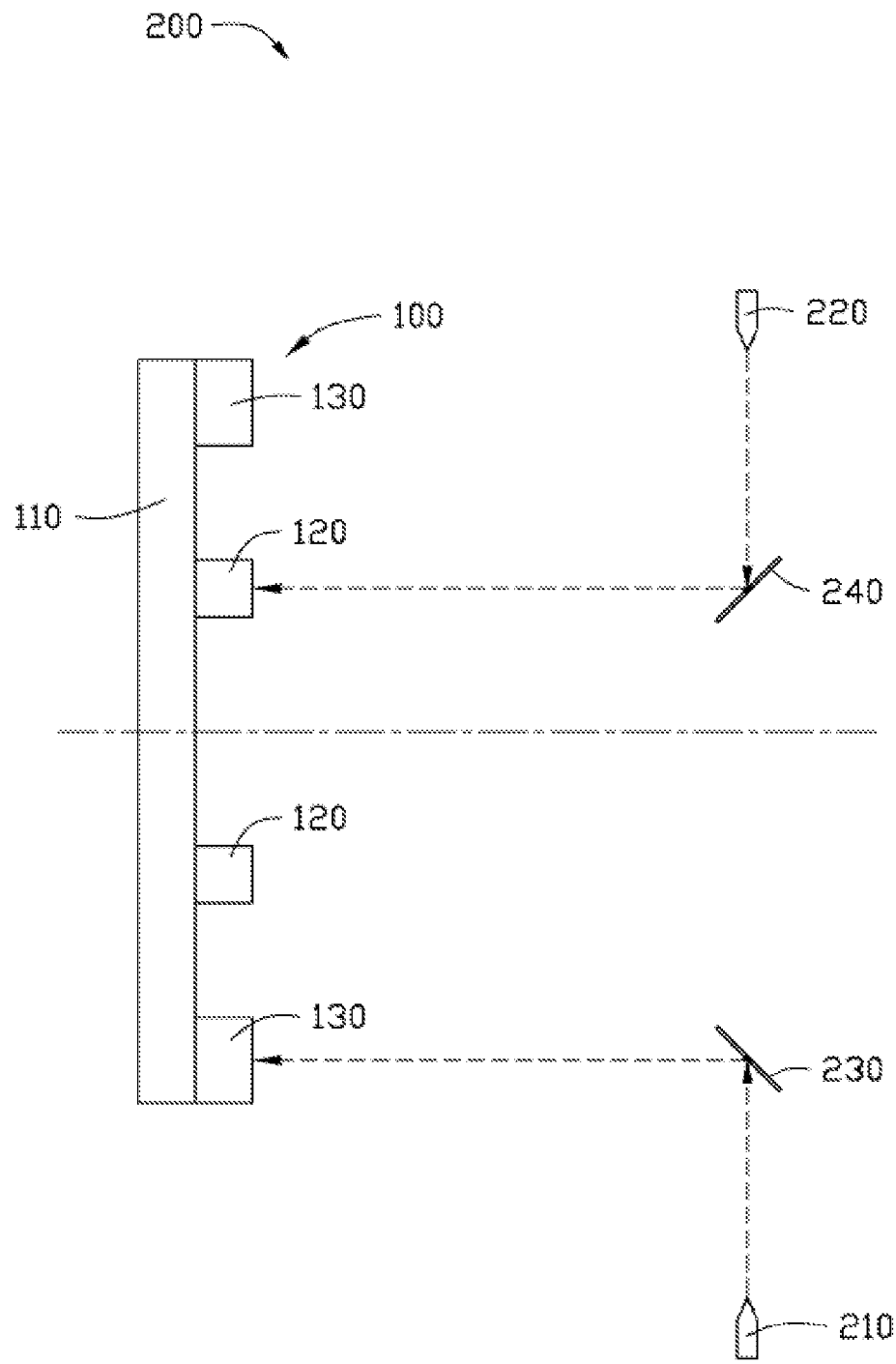
FIG. 5 is a schematic structural view of a light path system according to a third embodiment of the present disclosure.

As shown in FIG. 5, the present embodiment provides a light source system 200 that includes the wavelength conversion device 100, an excitation light source 210, and a first light source 220. The wavelength conversion device 100 (for brief figure illustration, only a partial structure thereof is illustrated) is referred to the first embodiment. In the present embodiment, for example, the first light guiding region 121 reflects the first light. It should be understood that in other embodiments, the first light guiding region 121 is configured to transmit the first light.

The excitation light source 210 and the first light source 220 are arranged on fixed positions. The wavelength conversion device 100 rotates around the center axis thereof at a constant velocity, and the excitation light source 210 continuously emits the excitation light when the wavelength conversion device 100 is in the operating state. Since the wavelength conversion device 100 is in a rotation state, the excitation light is incident to the first conversion unit 1311, the second conversion unit 1312, the third conversion unit 1313, and the first reflective region 132 in a time-division manner.

The light source system 200 of the present embodiment further includes a first light guiding structure 230 provided on an emitting light path of the excitation light and a second light guiding structure 240 provided on an emitting light path of the first light. Each of the first light guiding structure 230 and the second light guiding structure 240 is a regional film, which is coated with a film only at its center region. The excitation light is emitted through the center film-coated region of the first light guiding structure 230 and then is reflected to the conversion region 131, and the excitation light emitted from the conversion region 131 and unconverted excited light are transmitted through a film-uncoated region of the first light guiding structure 230. The first light is emitted through the center film-coated region of the second light guiding structure 240 and then is reflected to the first light guiding region 121, and the first light emitted from the first light guiding region 121 is transmitted through a film-uncoated region of the second light guiding structure 240.

When the excitation light is incident to the second conversion unit 1312, the first light source 220 configured to emit the first light is turned on simultaneously, and the position of the first light source 220 is fixed. In the present embodiment, the first light emitted by the first light source 220 is red laser light. When the excitation light is incident to the second conversion unit 1312, the second conversion unit 1312 convers a part of the blue laser light into red fluorescent light and emits the red fluorescent light and an unconverted part of the blue laser light. When the red laser light is incident to the first light guiding region 121 of the first light-emitting portion 120, the first light guiding region 121 reflects the red laser light. In this way, the red fluorescent light and the unconverted part of the blue laser light that are emitted from the second light-emitting portion 130 at the same period as the red laser light, and the red laser light are combined and then emitted.

It should be understood that the light source system 200 in this embodiment can achieve all the beneficial effects as described in the first embodiment.

Fourth Embodiment

Figure 6:
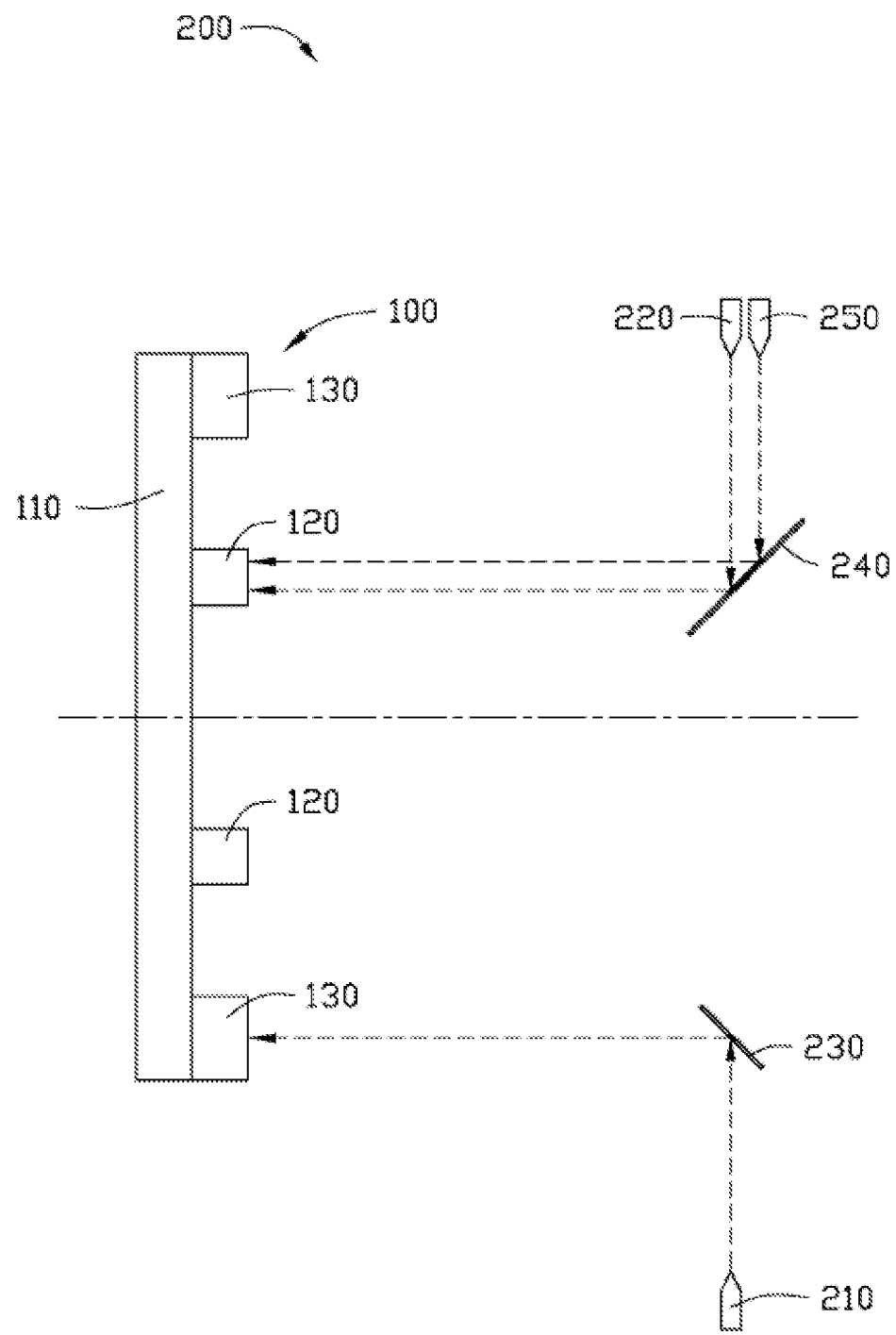
FIG. 6 is a schematic structural view of a light path system according to a fourth embodiment of the present disclosure.

As shown in FIG. 6, the present embodiment provides a light source system 200. The light source system 200 in the fourth embodiment is different from the third embodiment in that the light source system 200 includes two compensation light sources, i.e., a first light source 220 and a second light source 250. The wavelength conversion device 100 (for brief figure illustration, only a partial structure thereof is illustrated) of the light source system 200 is referred to the second embodiment. With reference to FIG. 4 again, the first light-emitting portion 120 further includes the second light guiding region 123, the first light guiding region 121, the second light guiding region 123 and the counterweight region 122 are spliced end to end to form a circular ring. The following only describes the differences from the third embodiment.

In the present embodiment, for example, the first light guiding region 121 reflects the first light and the second light guiding region 123 reflects the second light. It should be understood that in other embodiments, the first light guiding region 121 is configured to transmit the first light and the second light guiding region 123 is configured to transmit the second light.

In the present embodiment, color of the third-color excited light emitted from the third conversion unit 1313 is the same as that of the second light, and a degree of central angle of the second light guiding region 123 is the same as that of the third conversion unit 1313. The axis of symmetry of the second light guiding region 123 and the axis of symmetry of the third conversion unit 1313 are located on the same straight line, and the first light guiding region 121 is closer to the third conversion unit 1313 than the first reflective region 132.

When the excitation light is incident to the second conversion unit 1312, the first light source 220 configured to emit the first light is turned on simultaneously, and the position of the first light source 220 is fixed. In the present embodiment, the first light emitted by the first light source 220 is red laser light. When the excitation light is incident to the second conversion unit 1312, the second conversion unit 1312 convers a part of the blue laser light into red fluorescent light and emits the red fluorescent light and an unconverted part of the blue laser light. When the red laser light is incident to the first light guiding region 121 of the first light-emitting portion 120, the first light guiding region 121 reflects the red laser light. In this way, the red fluorescent light and the unconverted part of the blue laser light that are emitted from the second light-emitting portion 130 at the same period as the red laser light, and the red laser light are combined and then emitted.

When the excitation light is incident to the third conversion unit 1313, the second light source 250 configured to emit the second light is turned on simultaneously, and the position of the second light source 250 is fixed. In the present embodiment, the second light emitted by the second light source 250 is green laser light. When the excitation light is incident to the third conversion unit 1313, the third conversion unit 1313 convers a part of the blue laser light into green fluorescent light and emits the green fluorescent light and an unconverted part of the blue laser light. When the green laser light is incident to the second light guiding region 123 of the first light-emitting portion 120, the second light guiding region 123 reflects the green laser light. In this way, the green fluorescent light and the unconverted part of the blue laser light that are emitted from the second light-emitting portion 130 at the same period as the green laser light, and the green laser light are combined and then emitted.

It should be understood that the light source system 200 provided in the present embodiment can achieve all the beneficial effects described in the second embodiment.

The above only illustrates the embodiments of the present disclosure, and do not limit the scope of the present disclosure thereto. Equivalent structures or processes obtained based on this specification and drawings of the present disclosure, or their direct or indirect applications in other related technology field, all fall within the scope of the present disclosure.

The invention claimed is:

1. A wavelength conversion device, comprising:
a substrate;
a first light-emitting portion provided on the substrate, wherein the first light-emitting portion comprises a first light guiding region and a counterweight region arranged on a same layer as the first light guiding region, the first light guiding region is configured to guide first light, and the counterweight region is configured to balance weight distribution of the wavelength conversion device into substantially uniform distribution, and wherein the first light guiding region comprises a diffuse reflection layer; and
a second light-emitting portion provided on a same side of the substrate as the first light-emitting portion, wherein the second light-emitting portion comprises a conversion region configured to convert at least a part of excitation light into excited light when the conversion region receives the excitation light, and configured to emit the excited light.

2. The wavelength conversion device according to claim 1, wherein each of the first light-emitting portion and the second light-emitting portion is in a shape of circular ring, and the second light-emitting portion surrounds the first light-emitting portion.

3. The wavelength conversion device according to claim 2, wherein the conversion region comprises a first conversion unit, a second conversion unit, and a third conversion unit that are spliced, wherein the first conversion unit is configured to convert at least a part of the excitation light into first-color excited light and emit the first-color excited light, the second conversion unit is configured to convert at least a part of the excitation light into second-color excited light and emit the second-color excited light, and the third conversion unit is configured to convert at least a part of the excitation light into third-color excited light and emit the third-color excited light.

4. The wavelength conversion device according to claim 3, wherein each of the first conversion unit, the second conversion unit, and the third conversion unit comprises a base material, a diffuse reflection layer, and a luminescent layer that are sequentially stacked on the substrate.

5. The wavelength conversion device according to claim 4, wherein a material of the base material matches heat dissipation properties, optical properties, and thermal expansion coefficients of the diffuse reflection layer and the luminescent layer that are disposed on the base material.

6. The wavelength conversion device according to claim 3, wherein the second light-emitting portion further comprises a first reflective region configured to reflect the excitation light; and
each of the first conversion unit, the second conversion unit, the third conversion unit, and the first reflective region is in a shape of sector ring, and the first conversion unit, the second conversion unit, the third conversion unit, and the first reflective region are spliced end to end to form an entire circular ring.

7. The wavelength conversion device according to claim 3, wherein color of the first light is the same as color of the second-color excited light emitted from the second conversion unit; and
a degree of central angle of the first light guiding region is the same as a degree of central angle of the second conversion unit, an axis of symmetry of the first light guiding region and an axis of symmetry of the second conversion unit are located on a same straight line, and the counterweight region is closer to the second conversion unit than the first light guiding region.

8. The wavelength conversion device according to claim 6, wherein the first conversion unit, the second conversion unit, the third conversion unit, the first light guiding region, and the first reflective region have a same thickness in an emitting direction of the excited light.

9. The wavelength conversion device according to claim 2, wherein two annular grooves are provided on the substrate and configured to fix the first light-emitting portion and the second light-emitting portion to the substrate, respectively.

10. The wavelength conversion device according to claim 1, wherein the first light-emitting portion further comprises a second light guiding region configured to guide second light; and
the first light guiding region, the second light guiding region and the counterweight region are successively spliced end to end to form a circular ring.

11. The wavelength conversion device according to claim 10, wherein the first light guiding region is configured to reflect the first light, and the second light guiding region is configured to reflect the second light.

12. The wavelength conversion device according to claim 10, wherein color of the second light is the same as color of the third-color excited light emitted from the third conversion unit; and
a degree of central angle of the second light guiding region is the same as a degree of central angle of the third conversion unit, and an axis of symmetry of the second light guiding region and an axis of symmetry of the third conversion unit are located on a same straight line.

13. A light source system, comprising:
the wavelength conversion device, the wavelength conversion device comprising:
a substrate;
a first light-emitting portion provided on the substrate, wherein the first light-emitting portion comprises a first light guiding region and a counterweight region arranged on a same layer as the first light guiding region, the first light guiding region is configured to guide first light, and the counterweight region is configured to balance weight distribution of the wavelength conversion device into substantially uniform distribution, and wherein the first light guiding region comprises a diffuse reflection layer; and
a second light-emitting portion provided on a same side of the substrate as the first light-emitting portion, wherein the second light-emitting portion comprises a conversion region configured to convert at least a part of excitation light into excited light when the conversion region receives the excitation light, and configured to emit the excited light;
an excitation light source configured to emit the excitation light to the second light-emitting portion, at least a part of the excitation light being converted into excited light by the conversion region and then being emitted therefrom; and
a first light source configured to emit the first light to the first light guiding region.

14. The light source system according to claim 13, further comprising:
a second light source, wherein the first light-emitting portion further comprises a second light guiding region, and the first light guiding region, the second light guiding region and the counterweight region are successively spliced end to end to form a circular ring; and wherein the second light source is configured to emit second light to the second light guiding region.

15. The light source system according to claim 14, wherein the conversion region comprises a first conversion unit, a second conversion unit, and a third conversion unit that are spliced, wherein the first conversion unit is configured to convert at least a part of the excitation light into first-color excited light and emit the first-color excited light, the second conversion unit is configured to convert at least a part of the excitation light into second-color excited light and emit the second-color excited light, and the third conversion unit is configured to convert at least a part of the excitation light into third-color excited light and emit the third-color excited light;

color of the second light is the same as color of the third-color excited light emitted from the third conversion unit; and a degree of central angle of the second light guiding region is the same as a degree of central angle of the third conversion unit, an axis of symmetry of the second light guiding region and an axis of symmetry of the third conversion unit are located on a same straight line, and the first light guiding region is closer to the third conversion unit than the second light guiding region.

16. The wavelength conversion device according to claim 4, wherein the diffuse reflection layer comprises white scattering particles, which comprise aluminium oxide powder particles and titanium oxide powder particles and have a particle size ranging from 0.02 μtm to 1 μm.

17. The wavelength conversion device according to claim 5, wherein the diffuse reflection layer of the first conversion unit, the diffuse reflection layer of the second conversion unit, and the diffuse reflection layer of the third conversion unit comprise different types and numbers of diffuse reflection particles, and the diffuse reflection particles in the second conversion unit comprise primary particles of $TiO_2$ and auxiliary particles of materials different from $TiO_2$ so as to achieve a relatively high reflectivity of red light.

18. The wavelength conversion device according to claim 8, wherein each of the first conversion unit, the second conversion unit, and the third conversion unit has a triple-layer structure, and each of the first light guiding region and the first reflective region has a double-layer structure; and a thickness of at least one of a base material or a diffuse reflection layer of the first light guiding region and a thickness of at least one of a base material or a diffuse reflection layer of the first reflective region are increased in such a manner that the first conversion unit, the second conversion unit, the third conversion unit, the first light guiding region, and the first reflective region have a same thickness in the emitting direction of the excited light.

19. The wavelength conversion device according to claim 9, wherein sizes of the two annular grooves match color wheel modules and the first light-emitting portion.

20. The light source system according to claim 13, wherein the conversion region of the wavelength conversion device comprises a first conversion unit, a second conversion unit, a third conversion unit, and a first reflective region that are spliced;

the first conversion unit is configured to convert at least a part of the excitation light into first-color excited light and emit the first-color excited light, the second conversion unit is configured to convert at least a part of the excitation light into second-color excited light and emit the second-color excited light, the third conversion unit is configured to convert at least a part of the excitation light into third-color excited light and emit the third-color excited light, and the first reflective region is configured to reflect the excitation light; and the first conversion unit, the second conversion unit, the third conversion unit, the first light guiding region, and the first reflective region have a same thickness in an emitting direction of the excited light.

* * * * *